United States Patent
Cheng

(10) Patent No.: US 10,354,583 B2
(45) Date of Patent: Jul. 16, 2019

(54) ELECTROLUMINESCENT DISPLAY AND METHOD OF DRIVING THE SAME

(71) Applicant: INT TECH CO., LTD., Taipei (TW)

(72) Inventor: Shih-Song Cheng, Kaohsiung (TW)

(73) Assignee: INT TECH CO., LTD., Taipei (TW)

( * ) Notice: Subject to any disclaimer, the term of this patent is extended or adjusted under 35 U.S.C. 154(b) by 150 days.

(21) Appl. No.: 15/439,596

(22) Filed: Feb. 22, 2017

(65) Prior Publication Data

US 2018/0240401 A1 Aug. 23, 2018

(51) Int. Cl.
*G06F 1/00* (2006.01)
*G09G 3/3225* (2016.01)
*G09G 3/32* (2016.01)
*H01L 27/32* (2006.01)
*H01L 25/075* (2006.01)

(52) U.S. Cl.
CPC ............. *G09G 3/3225* (2013.01); *G09G 3/32* (2013.01); *H01L 27/3276* (2013.01); *G09G 2300/00* (2013.01); *H01L 25/0753* (2013.01)

(58) Field of Classification Search
CPC ...... G09G 3/3266; G09G 3/3275; G09G 3/32; H01L 27/32; H01L 27/15
See application file for complete search history.

(56) References Cited

U.S. PATENT DOCUMENTS

| 2011/0157126 | A1 | 6/2011 | Chung et al. |
| 2014/0333513 | A1* | 11/2014 | Park ..................... G09G 3/3266 345/76 |
| 2015/0002560 | A1 | 1/2015 | Kwon et al. |
| 2016/0042686 | A1 | 2/2016 | Feng |
| 2017/0186378 | A1* | 6/2017 | Na ........................ G09G 3/3266 |

FOREIGN PATENT DOCUMENTS

| TW | 2015011014 A | 1/2015 |
| TW | 201503083 A | 6/2015 |
| TW | 201606736 A | 2/2016 |

OTHER PUBLICATIONS

Office Action and Search Report dated Jan. 9, 2018, issued in counterpart Taiwanese Patent Application No. 106129623, with English Summary. (8 pages).

* cited by examiner

*Primary Examiner* — Michael A Faragalla
(74) *Attorney, Agent, or Firm* — Juan Carlos A. Marquez; Marguez IP Law Office, PLLC

(57) ABSTRACT

An electroluminescent (EL) display is disclosed. The EL display includes pixel units arranged in a matrix of N rows and M columns, N and M being natural numbers, scan lines configured to select pixel units of interest, data lines configured to provide data to selected pixel units, and a control line E_k configured to control immediately adjacent rows of pixel units coupled to (2k−1)-th and 2k-th scan lines, respectively, k being a natural number from 1 to N/2.

19 Claims, 8 Drawing Sheets

ELECTROLUMINESCENT DISPLAY AND METHOD OF DRIVING THE SAME

BACKGROUND

A display for presentation of an image may include pixels arranged in rows and columns in a matrix. Each row of the pixels is coupled via a scan line (or gate line) to a gate driver, while each column of the pixels is coupled via a data line (or source line) to a data driver. The gate drivers select corresponding rows of pixels of interest via their respective gate lines. The data drivers provide data to corresponding columns of pixels in the selected rows via their respective data lines. Moreover, each of the pixels includes an electroluminescent (EL) device that emits light according to data provided to the pixel.

SUMMARY

Embodiments of the present invention provide an electroluminescent (EL) display. The EL display includes pixel units arranged in a matrix of N rows and M columns, N and M being natural numbers, scan lines configured to select pixel units of interest, data lines configured to provide data to selected pixel units, and a control line E_k configured to control immediately adjacent rows of pixel units coupled to (2k−1)-th and 2k-th scan lines, respectively, k being a natural number from 1 to N/2.

In an embodiment, the control line E_k extends in parallel with the scan lines.

In another embodiment, a first pixel unit of the pixel units includes a first EL device and a first controller for controlling the first EL device. Moreover, a second pixel unit of the pixel units includes a second EL device and a second controller for controlling the second EL device.

In yet another embodiment, the first EL device is disposed over the second controller, and the second EL device is disposed over the first controller.

In still another embodiment, the first EL device includes a transistor, and a gate of the transistor is configured to receive a control signal sent via the control line E_k. Also, the second EL device includes a transistor, and a gate of this transistor is configured to receive a control signal sent via the control line E_k.

Some embodiments of the present invention provide a method of driving an electroluminescent (EL) display that comprises pixel units arranged in a matrix. The method includes selecting pixel units of interest by scanning the matrix through N scan lines, N being a natural number, providing image data to selected pixel units through M data lines, M being a natural number, and providing a control signal via a control line E_k to the selected pixel units, the control line E_k controlling immediately adjacent rows of pixel units coupled to (2k−1)-th and 2k-th scan lines, respectively, k being a natural number from 1 to N/2.

In an embodiment, the method further includes emitting light from a first EL device and a second EL device in a first pixel unit and a second pixel unit, respectively, of the selected pixel units according to the image data.

In another embodiment, the first EL device is disposed over a second controller of the second pixel unit for controlling the second EL device, and the second EL device is disposed over a first controller of the first pixel unit for controlling the first EL device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
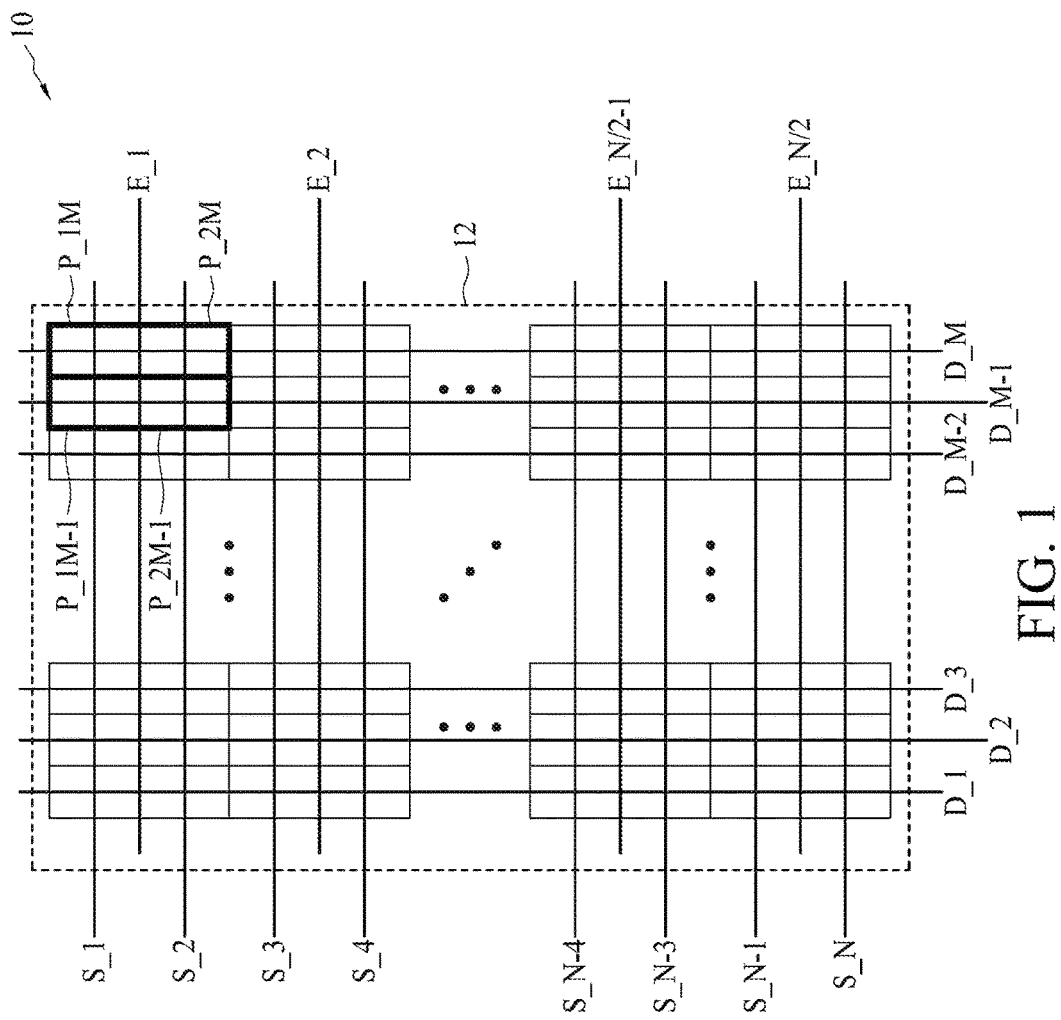
FIG. 1 is a schematic diagram of an electroluminescent (EL) display, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

FIG. 1 is a schematic diagram of an electroluminescent (EL) display 10, in accordance with some embodiments.

Referring to FIG. 1, the EL display 10 includes an active area 12 that may include an array of pixel units arranged in, for example, an N×M matrix, N and M each being a natural number. For brevity, only exemplary pixel units P_1M, P_2M, P_1M−1 and P_2M−1 are labeled. To address the pixel units, scan lines S_1 to S_N arranged in a row direction are configured to scan one or more corresponding rows of pixel units, and data lines D_1 to D_M arranged in a column direction are configured to provide image data to pixel units selected by the scan lines. In an embodiment, each pixel unit in the active area 12 includes three sub-pixel units (not shown), which may be used to display color red (R), color green (G) or color blue (B). Moreover, the three sub-pixel units may be arranged along the row direction. Accordingly, the number of data lines is 3×M. In another embodiment, for example, in a sub-pixel rendering (SPR) sensor, the number of sub-pixel units is not limited to three.

In addition to the scan lines S_1 to S_N and data lines D_1 to D_M, the EL display 10 further includes control lines E_1 to E_N/2 to control a luminescence state of pixel units. In the present embodiment, the control lines E_1 to E_N/2 extend in the row direction and are evenly arranged among the N rows of pixel units. As a result, each of the control lines E_1 to E_N/2 is configured to control two immediately adjacent rows of pixel units. For example, the first control line E_1 controls the first and second rows of pixel units coupled to the scan lines S_1 and S_2, respectively, the second control line E_2 controls the third and fourth rows of pixel units coupled to the scan lines S_3 and S_4, respectively, and so forth. Accordingly, a control line E_k controls immediately adjacent rows of pixel units coupled to scan lines $S\_2k-1$ and $S\_2k$, respectively, k being a natural number from 1 to N/2. As such, a single control signal E can be sent via the control line E_k to control the luminescence state of pixel units on different rows. Such a driving mechanism facilitates a controller and an EL device controlled by the controller in a pixel unit to be fabricated in a stack structure. Effectively, the EL display 10 can enjoy an efficient area cost and a flexible layout design.

Figure 2:
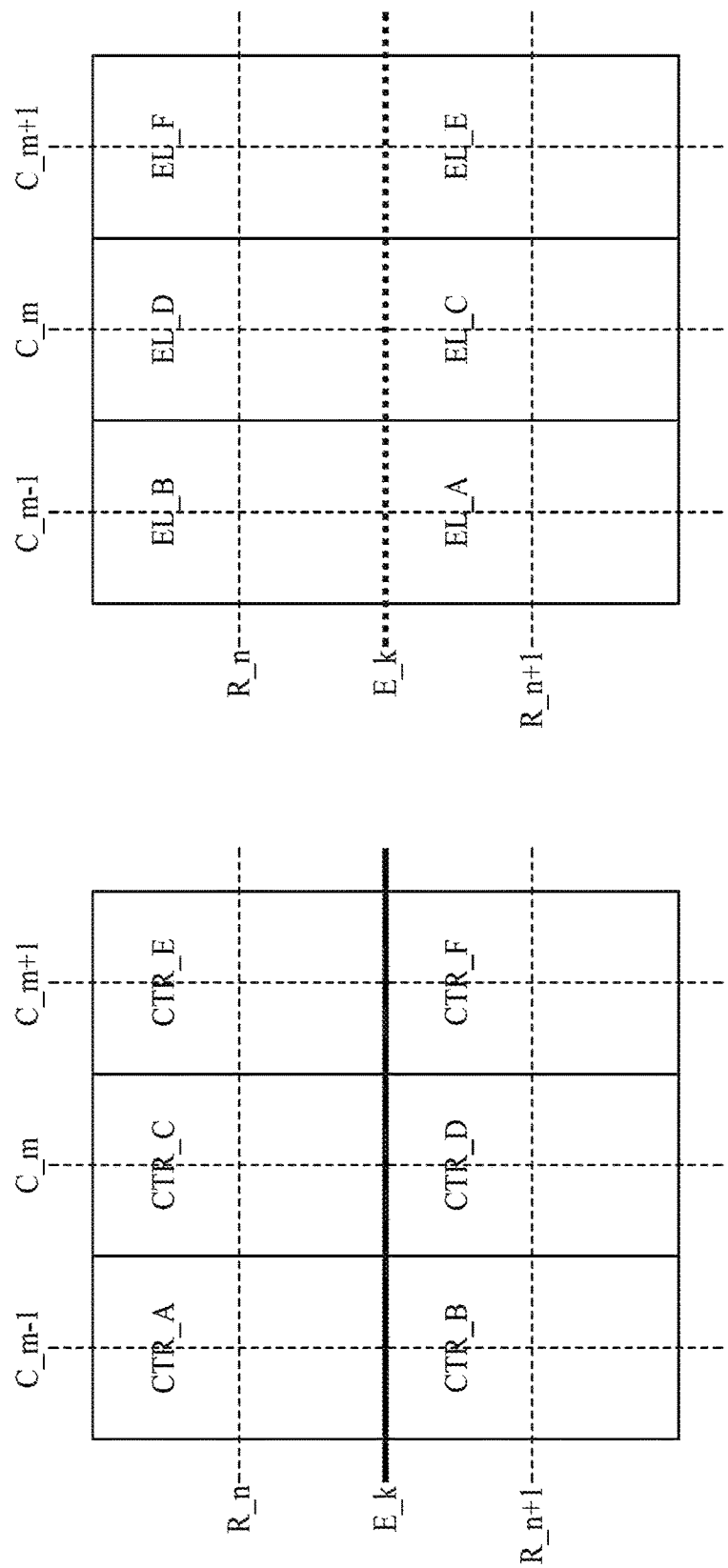
FIG. 2 is a schematic layout diagram of controllers and their respective EL devices in the EL display illustrated in FIG. 1, in accordance with some embodiments.

FIG. 2 is a schematic layout diagram of controllers CTR_A to CTR_F and their respective EL devices EL_A to EL_F in the EL display 10 illustrated in FIG. 1, in accordance with some embodiments.

Referring to FIG. 2, the EL devices EL_A to EL_F may be formed over a semiconductor substrate (not shown), while the controllers CTR_A to CTR_F for controlling the EL devices EL_A to EL_F may be formed between the semiconductor substrate and the EL devices EL_A to EL_F. The controller CTR_A and the EL device EL_A together form a pixel unit, the controller CTR_B and the EL device EL_B together form another pixel unit, and so forth. For brevity, only six such pixel units are shown. Each of the EL devices EL_A to EL_F includes, for example, a current-driven element that may include an organic light emitting diode (OLED), a micro LED or a quantum dot LED (QLED). In addition, each of the EL devices EL_A to EL_F may be used to display color red (R), color green (G) or color blue (B).

The controllers CTR_A, CTR_C and CTR_E are arranged in an n-th row labeled R_n, while the controllers CTR_B, CTR_D and CTR_F are arranged in an (n+1)-th row labeled R_n+1. Also, the controllers CTR_A and CTR_B are arranged in an (m−1)-th column labeled C_m−1, the controllers CTR_C and CTR_D are arranged in an m-th column labeled C_m, and the controllers CTR_E and CTR_F are arranged in an (m+1)-th column labeled C_m+1. A control line E_k for the R_n row and R_n+1 row of pixel units is provided.

Moreover, the EL devices EL_B, EL_D and EL_F are arranged in an n-th row R_n, while the EL devices EL_A, EL_C and EL_E are arranged in an (n+1)-th row R_n+1. Also, the EL devices EL_B and EL_A are arranged in an (m−1)-th column C_m−1, the EL devices EL_D and EL_C are arranged in an m-th column C_m, and the EL devices EL_F and EL_E are arranged in an (m+1)-th column C_m+1. As a result, the EL devices EL_B, EL_D and EL_F are stacked over the controllers CTR_A, CTR_C and CTR_E, respectively, while the EL devices EL_A, EL_C and EL_E are stacked over the controllers CTR_B, CTR_D and CTR_F, respectively. In the stack structure, a control signal is sent via the control line E_k and conductive vias (not shown) to the EL devices EL_A to EL_F.

Figure 3:
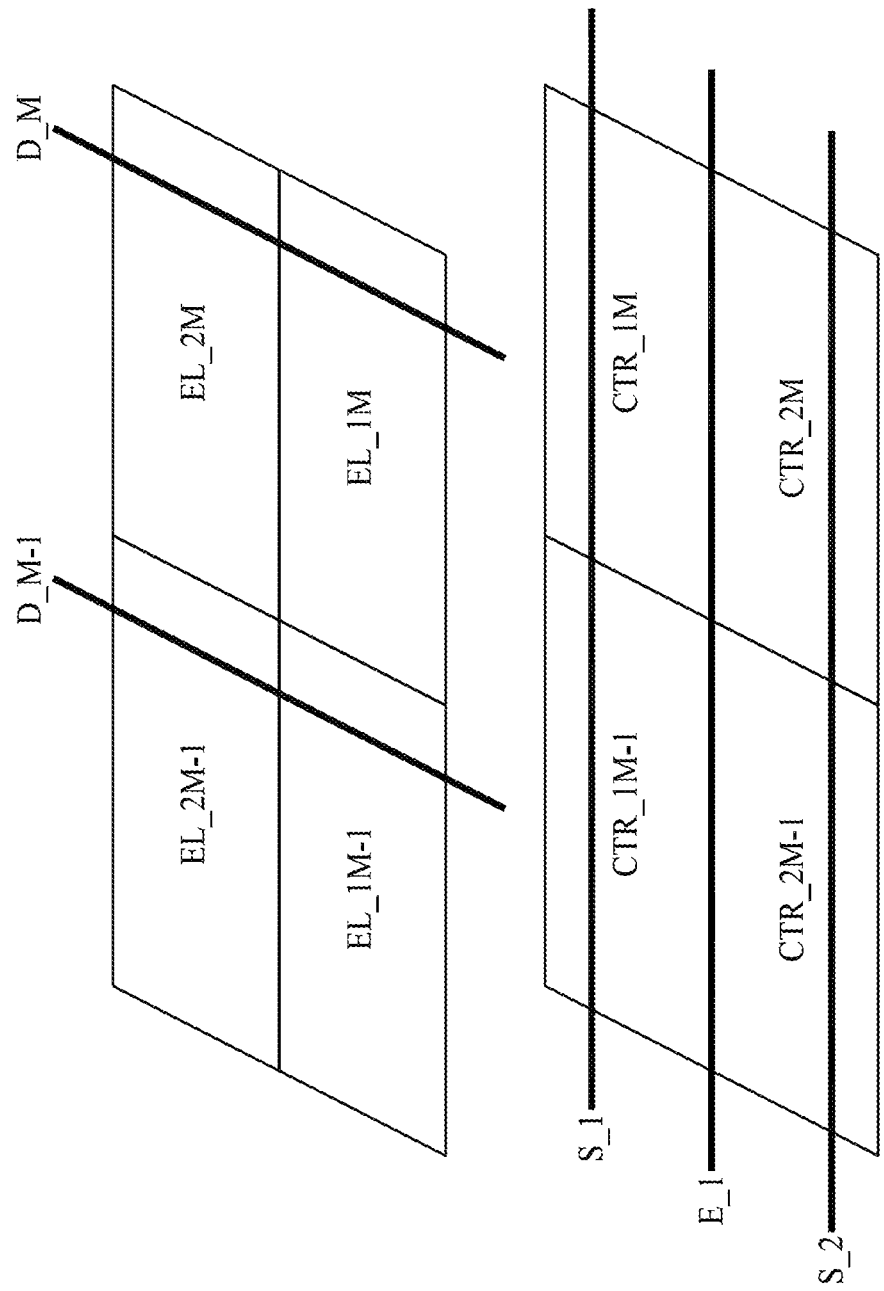
FIG. 3 is a schematic perspective view of exemplary pixel units in the EL display illustrated in FIG. 1, in accordance with some embodiments.

FIG. 3 is a schematic perspective view of exemplary pixel units in the EL display 10 illustrated in FIG. 1, in accordance with some embodiments.

Referring to FIG. 3, a controller CTR_1M and a corresponding EL device EL_1M form the exemplary pixel unit P_1M illustrated in FIG. 1, while a controller CTR_2M and a corresponding EL device EL_2M form the exemplary pixel unit P_2M illustrated in FIG. 1. In addition, the EL devices EL_1M and EL_2M are stacked over the controllers CTR_2M and CTR_1M, respectively.

Also, a controller CTR_1M−1 and a corresponding EL device EL_1M−1 form the exemplary pixel unit P_1M−1 illustrated in FIG. 1, while a controller CTR_2M−1 and a corresponding EL device EL_2M−1 form the exemplary pixel unit P_2M−1 illustrated in FIG. 1. In addition, the EL devices EL_1M−1 and EL_2M−1 are stacked over the controllers CTR_2M−1 and CTR_1M−1, respectively.

The controller CTR_1M is configured to receive a scan signal via the scan line S_1, and an image data via the data line D_M. Likewise, the controller CTR_2M is configured to receive a scan signal via the scan line S_2, and an image data via the data line D_M. Similarly, the controller CTR_1M−1 is configured to receive a scan signal via the scan line S_1, and an image data via the data line D_M−1. Moreover, the controller CTR_2M−1 is configured to receive a scan signal via the scan line S_2, and an image data via the data line D_M−1. A control line E_1 and the scan lines S_1 and S_2 extend in parallel with each other in a conductive layer associated with the controllers CTR_1M, CTR_2M, CTR_1M−1 and CTR_2M−1. Data lines D_M and D_M−1, substantially orthogonal to the control line E_1 and the scan lines S_1 and S_2, extend in parallel with each other in another conductive layer associated with the EL devices EL_1M, EL_2M, EL_1M−1 and EL_2M−1.

Figure 4A:
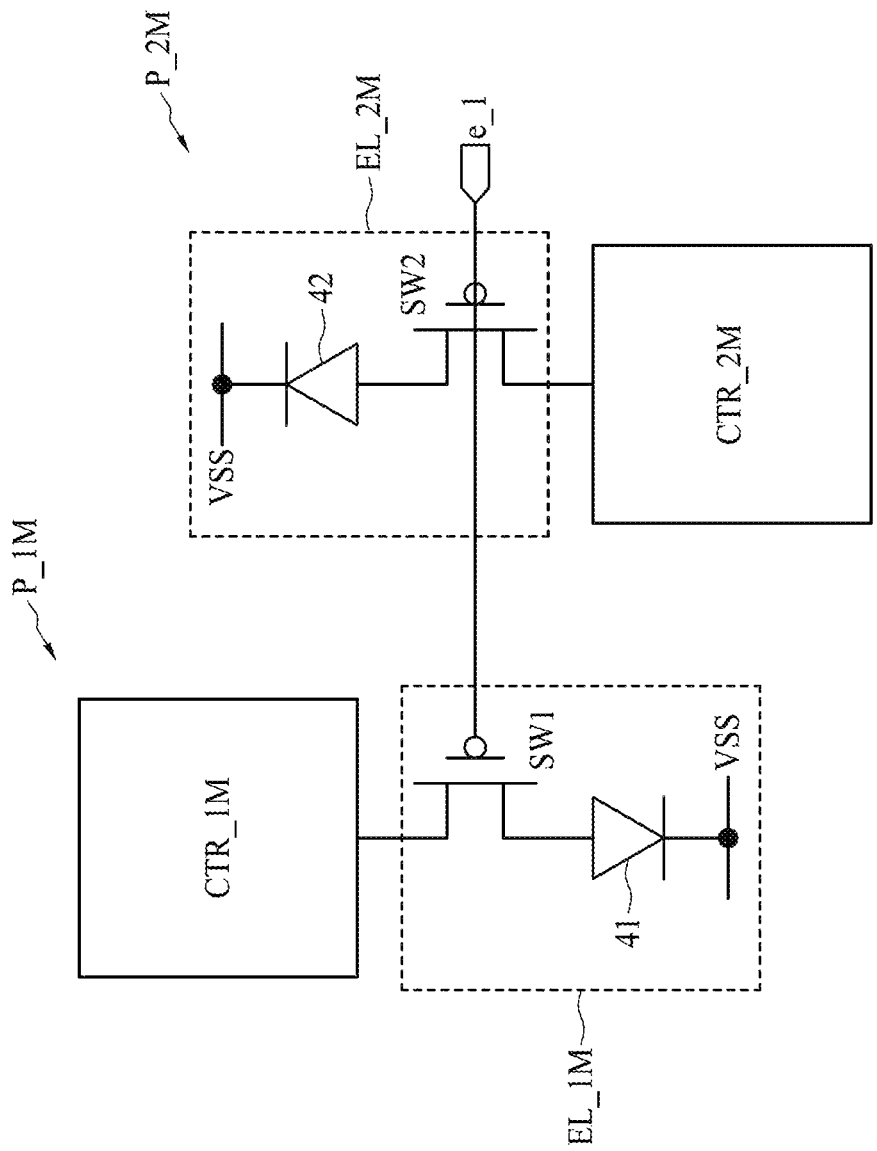
FIG. 4A is a diagram of exemplary pixel units in the EL display illustrated in FIG. 1, in accordance with an embodiment.

FIG. 4A is a diagram of exemplary pixel units P_1M and P_2M in the EL display 10 illustrated in FIG. 1, in accordance with an embodiment.

Referring to FIG. 4A, a first pixel unit P_1M includes a first controller CTR_1M and a first EL device EL_1M. Further, the first EL device EL_1M includes a first light emitting diode 41 and a transistor SW1 which serves as a first switch. In the present embodiment, the transistor SW1 includes a p-type transistor, which may be a p-type metal-oxide-semiconductor (PMOS) transistor or a p-type thin film transistor (TFT). Moreover, a gate of the transistor SW1 is configured to receive a first control signal e_1 sent via a first control line E_1. A source of the transistor SW1 is coupled to the first controller CTR_1M. A drain of the transistor SW1 is coupled to an anode of the first light emitting diode 41. In addition, a cathode of the first light emitting diode 41 is coupled to a power source VSS. In an embodiment, VSS has approximately a ground voltage level or a minus voltage level such as minus five volts (−5V).

In operation, when the first pixel unit P_1M is selected, a first image data is stored in the first controller CTR_1M. During an emission period, the transistor SW1 is turned on by the first control signal e_1, allowing a current to flow through the first light emitting diode 41. The current has a magnitude determined by the first image data.

Similarly, a second pixel unit P_2M includes a second controller CTR_2M and a second EL device EL_2M. Further, the second EL device EL_2M includes a second light emitting diode 42 and a transistor SW2 which serves as a second switch. In the present embodiment, the transistor SW2 includes a p-type transistor, which may be a PMOS transistor or a p-type TFT. Moreover, a gate of the transistor SW2, coupled to the gate of the transistor SW1, is configured to receive the first control signal e_1 sent via the first control line E_1. A source of the transistor SW2 is coupled to the second controller CTR_2M. A drain of the transistor SW2 is coupled to an anode of the second light emitting diode 42. In addition, a cathode of the second light emitting diode 42 is coupled to the power source VSS.

In operation, when the second pixel unit P_2M is selected, a second image data is stored in the second controller CTR_2M. During an emission period, the transistor SW2 is turned on by the first control signal e_1, allowing a current to flow through the second light emitting diode 42. The current has a magnitude determined by the second image data.

Figure 4B:
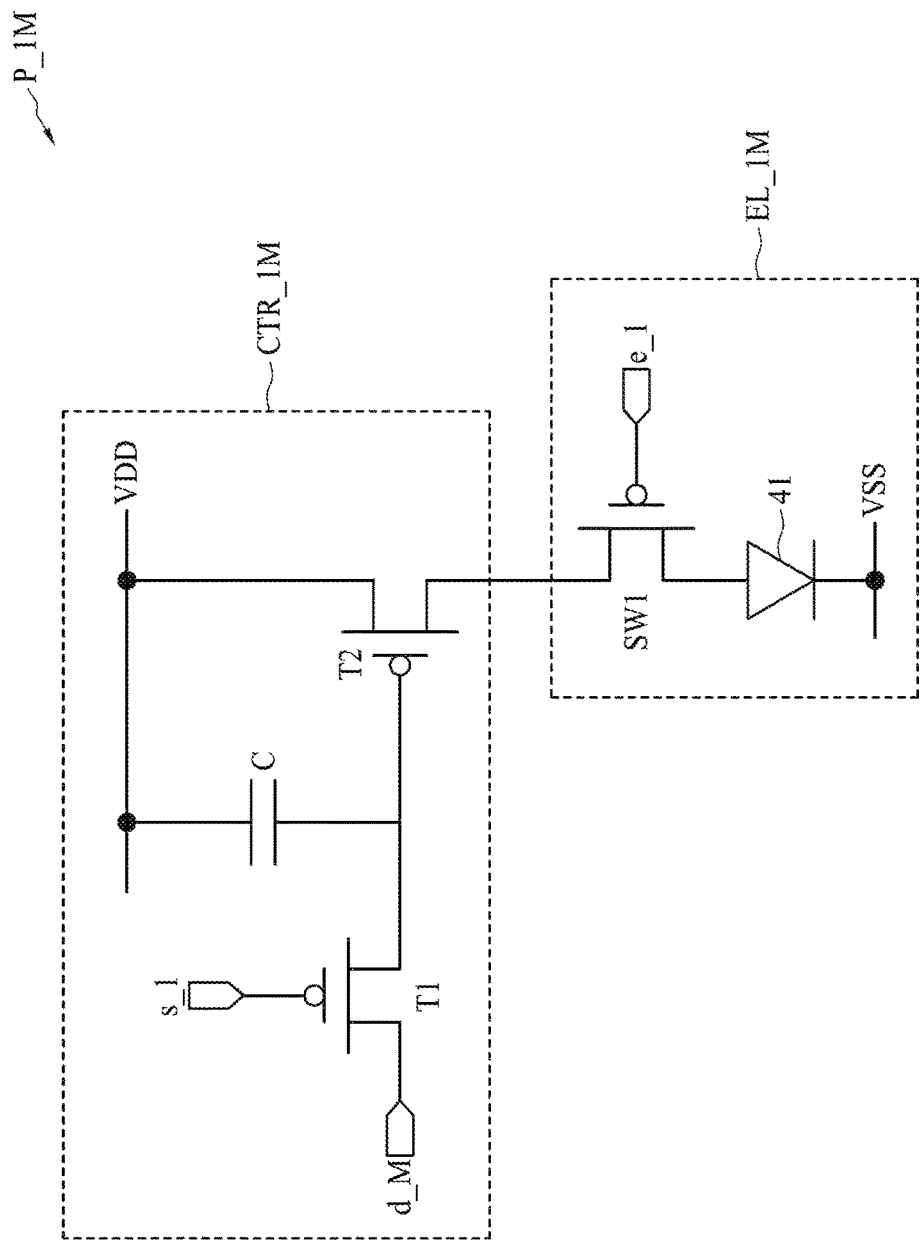
FIG. 4B is a circuit diagram of an exemplary pixel unit in the EL display illustrated in FIG. 1, in accordance with an embodiment.

FIG. 4B is a circuit diagram of the exemplary pixel unit P_1M in the EL display 10 illustrated in FIG. 1, in accordance with an embodiment.

Referring to FIG. 4B, the first controller CTR_1M of the first pixel unit P_1M includes a first transistor T1, a second transistor T2 and a capacitor C. Each of the first transistor T1 and the second transistor T2 includes a p-type transistor, which may be a PMOS transistor or a p-type TFT. A gate of the first transistor T1 receives a scan signal s_1 sent via a scan line S_1. A source of the first transistor T1 receives an image data d_M sent via a data line D_M. A drain of the first transistor T1 is coupled to one end of the capacitor C and a gate of the second transistor T2. Persons having ordinary skill in the art will understand that a source terminal and a drain terminal of a transistor may be interchangeable, depending on voltage levels applied to these terminals. Further, a source of the second transistor T2 is coupled to another power source VDD. In an embodiment, VDD has a voltage level of approximately five volts (5V). A drain of the second transistor T2 is coupled to a source of the transistor SW1. The second transistor T2 serves as a driving transistor that, when turned on, allows a current flows from VDD towards the first light emitting diode 41. Moreover, the other end of the capacitor C is coupled to VDD. The circuit structure of the pixel unit P_1M is not limited to the specific embodiment as illustrated. For example, the first controller CTR_1M may include more transistors or capacitors to perform a desired function, such as a compensation function to alleviate a threshold effect in the second transistor T2 that may adversely affect uniform luminescence of the pixel units in the EL display 10.

In operation, when the first transistor T1 is turned on by the scan signal s_1, the first pixel unit P_1M is selected. Subsequently, an image data d_M is stored in the capacitor C. During an emission period, when the transistor SW1 is turned on by the first control signal e_1, a current flowing through the first light emitting diode 41 causes the first light emitting diode 41 to emit light having an intensity determined by the image data d_M.

Figure 5A:
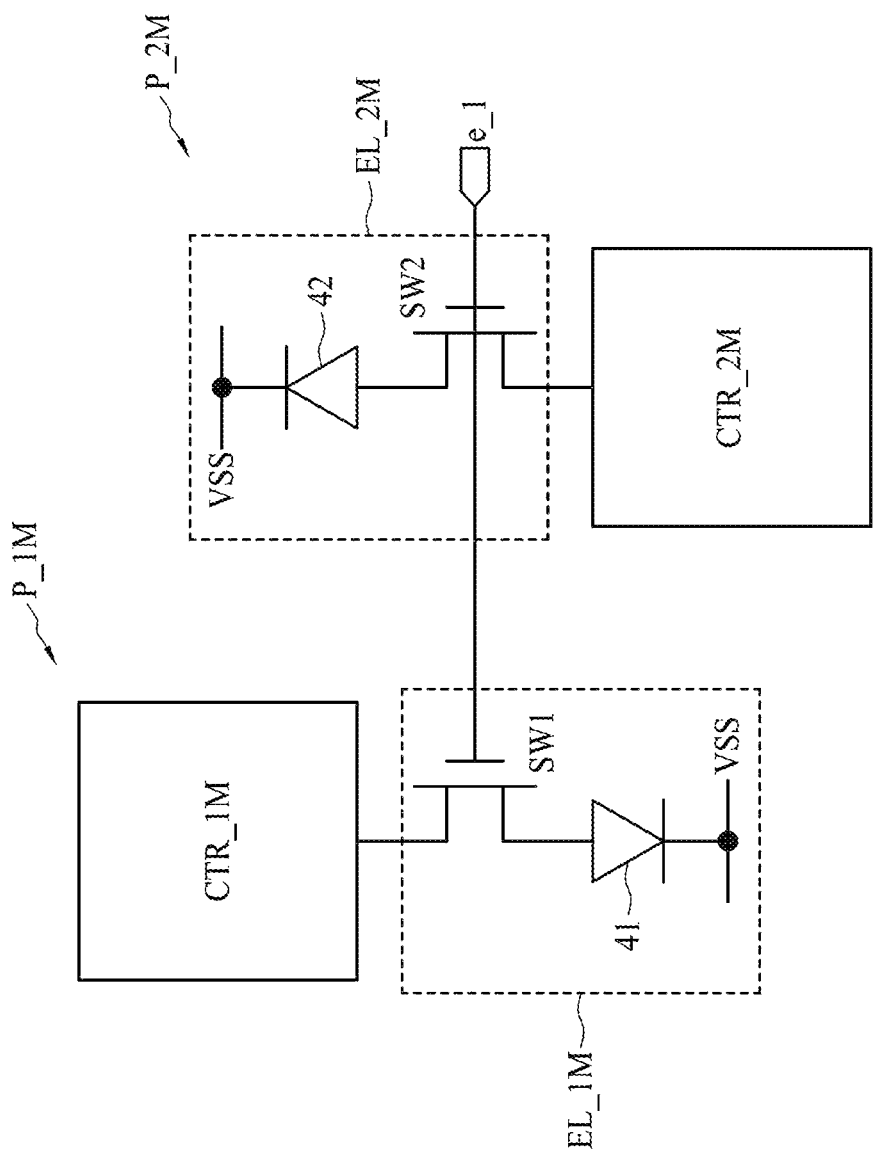
FIG. 5A is a diagram of exemplary pixel units in the EL display illustrated in FIG. 1, in accordance with another embodiment.

FIG. 5A is a diagram of exemplary pixel units P_1M and P_2M in the EL display 10 illustrated in FIG. 1, in accordance with another embodiment.

Referring to FIG. 5A, the circuit structure of the pixel units P_1M and P_2M is similar to that described and illustrated with reference to FIG. 4A except that, for example, n-type transistors SW1 and SW2 replace the p-type transistors. In an embodiment, an n-type transistor may include an n-type metal-oxide-semiconductor (NMOS) transistor or an n-type thin film transistor (TFT).

Figure 5B:
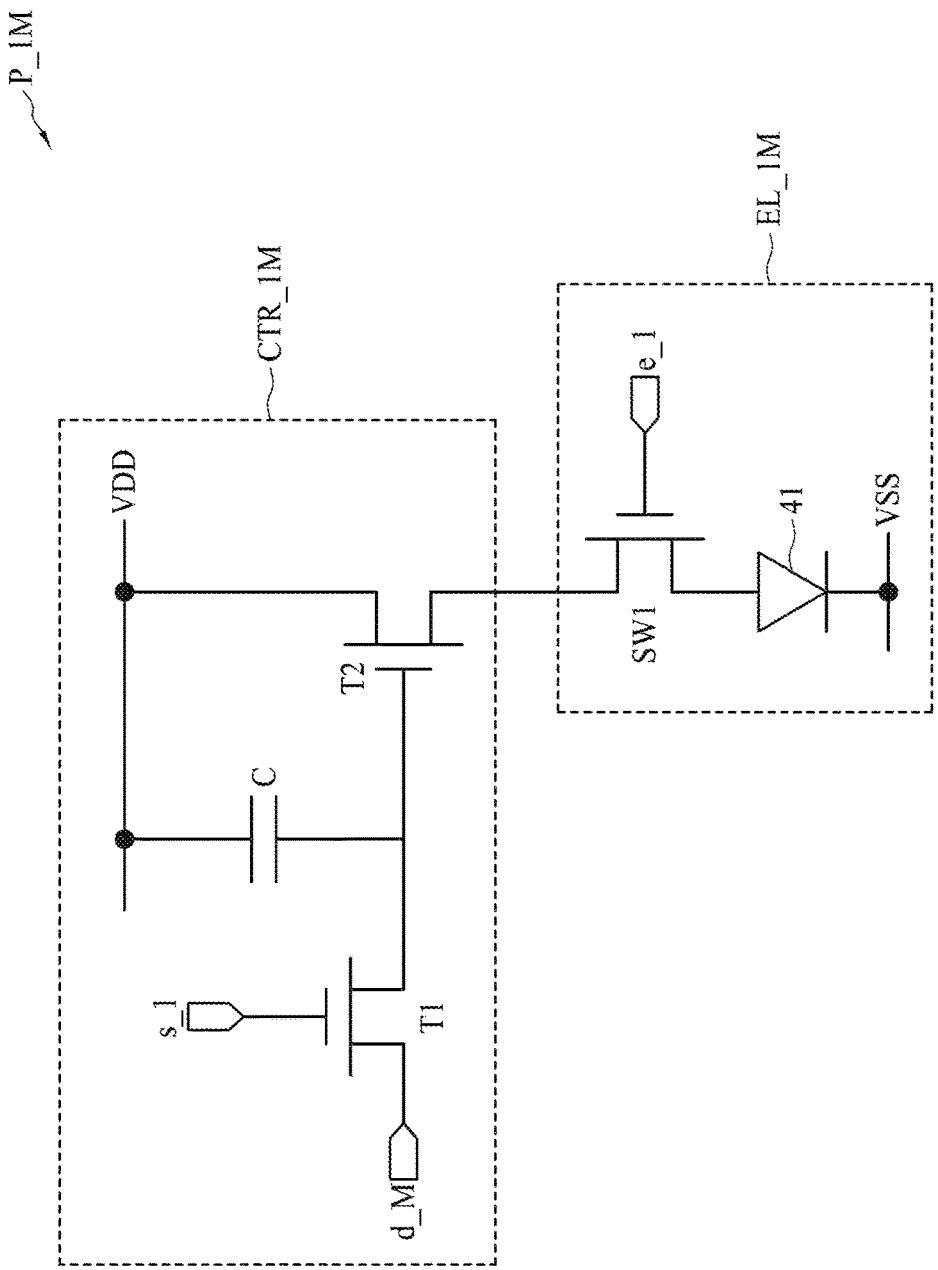
FIG. 5B is a circuit diagram of an exemplary pixel unit in the EL display illustrated in FIG. 1, in accordance with another embodiment.

FIG. 5B is a circuit diagram of an exemplary pixel unit P_1M in the EL display 10 illustrated in FIG. 1, in accordance with another embodiment.

Referring to FIG. 5B, the circuit structure of the pixel unit P_1M is similar to that described and illustrated with reference to FIG. 4B except that, for example, n-type transistors T1 and T2 replace the p-type transistors.

Figure 6:
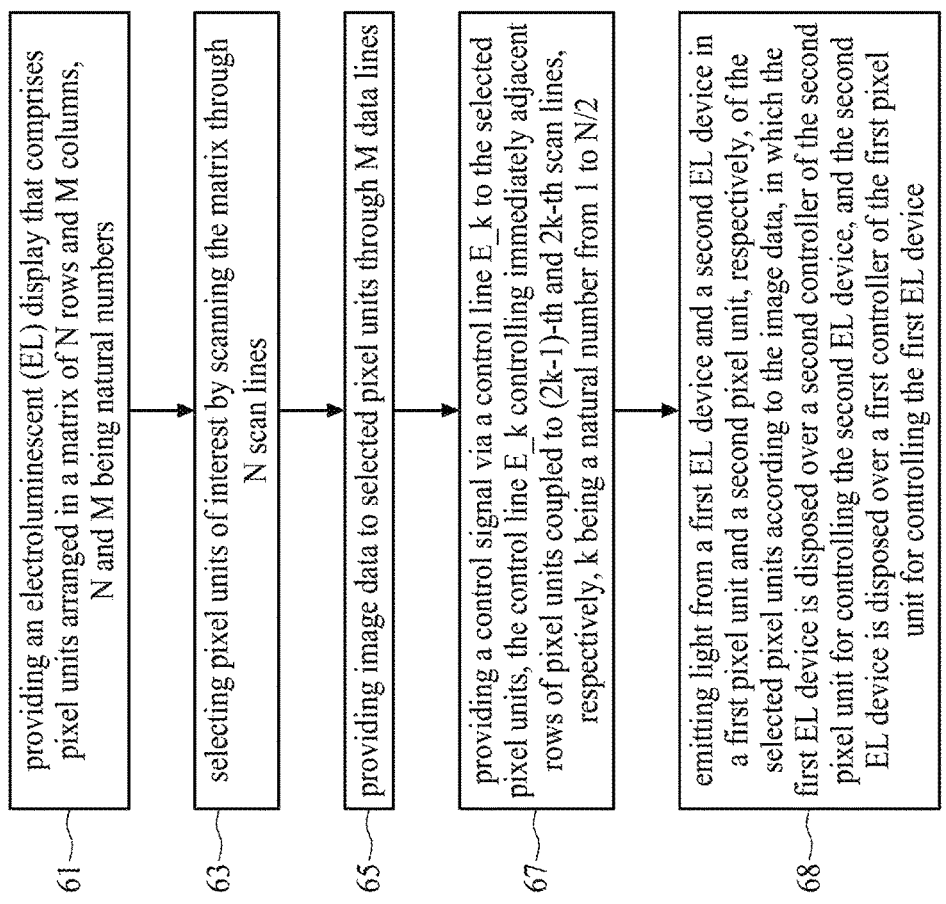
FIG. 6 is a flow diagram showing a method of driving an EL display, in accordance with some embodiments.

FIG. 6 is a flow diagram showing a method of driving an EL display, in accordance with some embodiments.

Referring to FIG. 6, in operation 61, an electroluminescent (EL) display is provided. The EL display, such as the EL display 10 described and illustrated with reference to FIG. 1, comprises pixel units arranged in a matrix of N rows and M columns, N and M being natural numbers.

In operation 63, one or more pixel units of interest are selected by scanning the matrix through N scan lines.

In operation 65, image data are provided to selected pixel units through M data lines.

In operation 67, a control signal is provided via a control line E_k to the selected pixel units. The control line E_k is configured to control immediately adjacent rows of pixel units coupled to scan lines S_2k−1 and S_2k, respectively, k being a natural number from 1 to N/2.

Subsequently, in operation 68, light is emitted from a first EL device and a second EL device in a first pixel unit and a second pixel unit, respectively, of the selected pixel units according to the image data. The first EL device is disposed over a second controller of the second pixel unit for controlling the second EL device, and the second EL device is disposed over a first controller of the first pixel unit for controlling the first EL device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electroluminescent (EL) display, comprising:
   pixel units arranged in a matrix of N rows and M columns, N and M being natural numbers;
   scan lines configured to select pixel units of interest;
   data lines configured to provide data to selected pixel units; and
   a control line E_k configured to control immediately adjacent rows of pixel units coupled to (2k−1)-th and 2k-th scan lines, respectively, k being a natural number from 1 to N/2;
   wherein a first pixel unit of the pixel units comprises a first EL device and a first controller for driving a current to flow toward the first EL device, and a second pixel unit of the pixel units comprises a second EL device and a second controller for driving a current to flow toward the second EL device; the first EL device is disposed on a first conductive layer, and the first conductive layer is stacked over a second conductive layer on which the second controller is disposed.

2. The EL display according to claim 1, wherein the control line E_k extends in parallel with the scan lines.

3. The EL display according to claim 1, wherein the second EL device is disposed on the first conductive layer stacked over the second conductive layer on which the first controller is disposed.

4. The EL display according to claim 1, wherein the first EL device includes a transistor, and a gate of the transistor is configured to receive a control signal sent via the control line E_k.

5. The EL display according to claim 1, wherein the second EL device includes a transistor, and a gate of the transistor is configured to receive a control signal sent via the control line E_k.

6. The EL display according to claim 1, wherein each of the first EL device and the second EL device includes one of an organic light emitting diode (OLED), a micro LED and a quantum dot LED (QLED).

7. The EL display according to claim 1, wherein each of the first controller and the second controller includes a first transistor, wherein a gate of the first transistor is configured to receive a scan signal, and a source of the first transistor is configured to receive an image data.

8. The EL display according to claim 7, wherein each of the first controller and the second controller includes a second transistor configured to allow a corresponding driven current to flow towards a corresponding one of the first and second EL devices.

9. The EL display according to claim 8, wherein each of the first controller and the second controller includes a capacitor configured to store the image data.

10. A method of driving an electroluminescent (EL) display that comprises pixel units arranged in a matrix, the method comprising:
    selecting pixel units of interest by scanning the matrix through N scan lines, N being a natural number;
    providing image data to selected pixel units through M data lines, M being a natural number; and
    providing a control signal via a control line E_k to the selected pixel units, the control line E_k controlling immediately adjacent rows of pixel units coupled to (2k−1)-th and 2k-th scan lines, respectively, k being a natural number from 1 to N/2;
    wherein the pixel units comprise a first pixel unit and a second pixel unit the method further comprises:
    utilizing a first controller of the first pixel unit to drive a current to flow toward a first EL device in the first pixel unit, the first EL device being disposed on a first conductive layer; and
    utilizing a second controller of the second pixel unit to drive a current to flow toward a second EL device in the second pixel unit, the second controller being disposed on a second conductive layer, wherein the first conductive layer on which the first EL device is disposed is stacked over the second conductive layer on which the second controller is disposed.

11. The method according to claim 10, wherein the control line E_k extends in parallel with the scan lines.

12. The method according to claim 10 further comprising:
    emitting light from the first EL device and the second EL device in the first pixel unit and the second pixel unit, respectively, of the selected pixel units according to the image data.

13. The method according to claim 10, wherein the second EL device is disposed on the first conductive layer stacked over the second conductive layer on which the first controller is disposed.

14. The method according to claim 10, wherein the first EL device includes a transistor, and a gate of the transistor is configured to receive a control signal sent via the control line E_k.

15. The method according to claim 10, wherein the second EL device includes a transistor, and a gate of the transistor is configured to receive a control signal sent via the control line E_k.

16. The method according to claim 10, wherein each of the first EL device and the second EL device includes one of an organic light emitting diode (OLED), a micro LED and a quantum dot LED (QLED).

17. The method according to claim 10, wherein each of the first controller and the second controller includes a first transistor wherein a gate of the first transistor is configured to receive a scan signal, and a source of the first transistor is configured to receive the image data.

18. The method according to claim 17, wherein each of the first controller and the second controller includes a second transistor configured to allow a corresponding driven current to flow towards a corresponding one of the first and second EL devices.

19. The method according to claim 18, wherein each of the first controller and the second controller includes a capacitor configured to store the image data.

* * * * *